(12) United States Patent
Yang

(10) Patent No.: US 7,501,314 B2
(45) Date of Patent: Mar. 10, 2009

(54) HEAT SINK AND METHOD FOR FABRICATING THE SAME

(75) Inventor: Hsiu-Fei Yang, Taipei (TW)

(73) Assignee: Inventec Corporation, Taipei (TW)

( * ) Notice: Subject to any disclaimer, the term of this patent is extended or adjusted under 35 U.S.C. 154(b) by 124 days.

(21) Appl. No.: 11/551,036

(22) Filed: Oct. 19, 2006

(65) Prior Publication Data

US 2007/0257358 A1 Nov. 8, 2007

(30) Foreign Application Priority Data

May 8, 2006 (TW) .............................. 95116204 A

(51) Int. Cl.
*H01L 21/44* (2006.01)
*H01L 21/48* (2006.01)

(52) U.S. Cl. .................. 438/122; 257/706; 257/712; 257/E23.101

(58) Field of Classification Search .................. 438/122; 257/706, 712, E23.101

See application file for complete search history.

(56) References Cited

U.S. PATENT DOCUMENTS

| 5,652,463 | A | * | 7/1997 | Weber et al. ................ 257/706 |
| 5,886,407 | A | * | 3/1999 | Polese et al. ................ 257/706 |
| 6,534,859 | B1 | * | 3/2003 | Shim et al. .................. 257/706 |
| 6,775,140 | B2 | * | 8/2004 | Shim et al. .................. 361/704 |

OTHER PUBLICATIONS

IBM Tech Discl. Bulletin, Sep. 1992, (TDB #NA9209264).*

* cited by examiner

*Primary Examiner*—Nitin Parekh

(57) ABSTRACT

A heat sink and method for fabricating the same are disclosed. The heat sink includes a lower substrate having a concave portion, a supporting column formed on the concave portion of the lower substrate, and an upper substrate opposed to the lower substrate and tightly fixed to the lower substrate so as to form a cooled liquid receiving space therebetween, wherein the upper substrate has a concave portion formed at a position corresponding to the supporting column of the lower substrate so as to engage with the supporting column.

12 Claims, 6 Drawing Sheets

HEAT SINK AND METHOD FOR FABRICATING THE SAME

BACKGROUND OF THE INVENTION

1. Field of the Invention

The present invention relates generally to a heat sink and fabrication method thereof, and more particularly, to a heat sink having supporting columns and a method for fabricating the same.

2. Description of Related Art

With the rapid development of integrated circuit design and fabrication technology, the level of integration of integrated circuits increases. Accordingly, how to efficiently dissipate heat generated by the integrated circuits during operation has become much more critical. Generally, heat sinks are disposed on the integrated circuits for heat dissipation. Heat sinks are made of materials that can absorb and dissipate heat efficiently. To further improve heat dissipating efficiency, heat sinks can be used in combination with fins, fans or liquid cooled structures. The heat sinks, if used in combination with liquid cooled structures, can obtain better heat dissipating efficiency.

FIG. 3A is an exploded diagram of a conventional liquid cooled heat sink 2. The heat sink 2 comprises a lower substrate 21 and an upper substrate 22 opposed to the lower substrate 21. The lower substrate 21 has a concave portion 211 and a plurality of supporting columns 23 formed on the concave portion 211 of the lower substrate 21 for supporting the upper substrate 22. A through hole 221 is formed at a corner of the upper substrate 22. Referring to FIG. 3B, after the lower substrate 21 and the upper substrate 22 are tightly fixed together through fixing components (not shown) or by a soldering mechanism, the supporting columns 23 can effectively support the upper substrate 22. Therefore, a cooled liquid 25, after injected through the through hole 221 into a receiving space 24 formed between the upper substrate 22 and the lower substrate 21 and the through hole 221 is sealed, dissipate heat by transforming itself from a vapor state into a liquid state and vice versa according to different working temperatures.

The fabrication method for fabricating the supporting columns 23 is shown in FIG. 4. Aggregate is continuously deposited on the concave portion 211 of the lower substrate 21 at positions where the supporting columns 23 are to be formed until the aggregate has a height equal to a certain level such that cone-shaped supporting columns 23 can be obtained. However, in the above fabrication process, the density of a capillary structure of the supporting columns 23 is difficult to be controlled and the capillary structure is easy to be broken, thereby resulting in a low density capillary structure of the supporting columns 23. The low density of the capillary structure further leads to small capillary forces to absorb the cooled liquid 25 injected into the receiving space 24. Thereby, the circulation efficiency of the cooled liquid 25 in the receiving space 24 is adversely affected, that is, the heat circulation efficiency is adversely affected.

Furthermore, as shown in FIGS. 3A and 3B, because surface 222 of the upper substrate 22 contacts with nothing but top portions 231 of the supporting columns 23 only, it leads to low strength of combining structure between the surface 222 of the upper substrate 22 and the top portions 231 of the supporting columns 23, and poor continuity of the capillary structure.

Accordingly, there exists a strong need in the art for a heat sink and fabrication method which can control and improve capillary structure and density of the supporting columns so as to increase heat dissipating efficiency of the heat sink.

SUMMARY OF THE INVENTION

Accordingly, an objective of the present invention is to provide a heat sink and method for fabricating the same which can control density and capillary structure of the supporting columns of the heat sink.

Another objective of the present invention is to provide a heat sink and method for fabricating the same which can increase strength of the combining structure between the substrate and the supporting columns and increase continuity of the capillary structure.

In order to attain the objectives mentioned above and the others, a heat sink is provided according to the present invention, which comprises: a lower substrate having a concave portion; at least a supporting column formed on the concave portion of the lower substrate; and an upper substrate opposed to the lower substrate and tightly fixed to the lower substrate so as to form a cooled liquid receiving space therebetween, wherein the upper substrate has a concave portion formed at a position corresponding to the supporting column of the lower substrate so as to engage with the supporting column.

The method for fabricating the heat sink according to the present invention comprises: preparing a lower substrate with a concave portion; disposing a material injection board having at least a through hole on the concave portion of the lower substrate, wherein the through hole of the material injection board is located at a position of the lower substrate where a supporting column is to be formed; injecting aggregate into the through hole of the material injection board; disposing the substrate, the material injection board and the aggregate under a high temperature environment for sintering; removing the material injection board from the lower substrate after the aggregate is formalized so as to form a supporting column on the concave portion of the substrate; and preparing an upper substrate and tightly fixing the upper and lower substrates together such that a receiving space can be formed therebetween, wherein the upper substrate has a concave portion formed at a position corresponding to the supporting column of the lower substrate so as to engage with the supporting column.

Compared with the prior art, the heat sink and method for fabricating the same of the present invention not only can control and improve density and capillary structure of the supporting columns, but also increase strength of the combining structure between the upper substrate and the supporting columns, and increase continuity of capillary structure. Thus, heat dissipating efficiency of the heat sink is increased.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
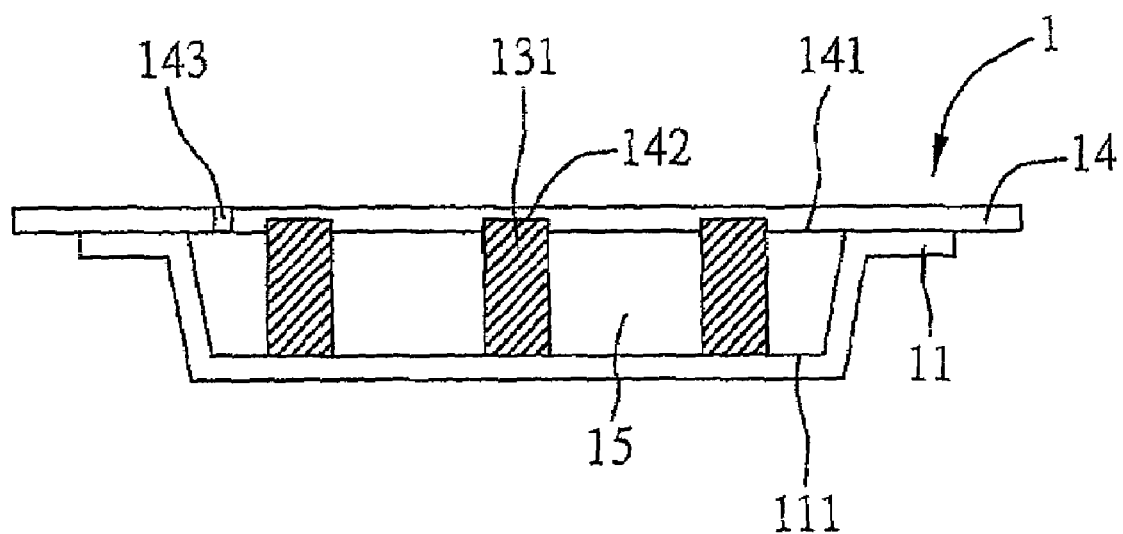
FIG. 1 is a cross sectional diagram of a heat sink according to the present invention.

FIG. 1 is a cross sectional diagram of a heat sink 1 of the present invention. The heat sink 1 of the present invention comprises a lower substrate 11 having a concave portion 111, at least one supporting column 131 formed on the concave portion 111 of the lower substrate 11, an upper substrate 14 opposed and tightly fixed to the lower substrate 11 so as to form a cooled liquid receiving space 15 therebetween. At least one concave portion 142 is formed on a surface 141 of the upper substrate 14 at a position corresponding to the supporting column 131 of the lower substrate 11 so as to engage with the supporting column 131.

In the present embodiment, a through hole 143 is formed at a corner of the upper substrate 14. A cooled liquid can be injected through the through hole 143 into the receiving space 15 to increase heat dissipating efficiency of the heat sink 1.

FIGS. 2A to 2F illustrate a fabrication method for fabricating the heat sink 1 according to the present invention.

Figure 2A:
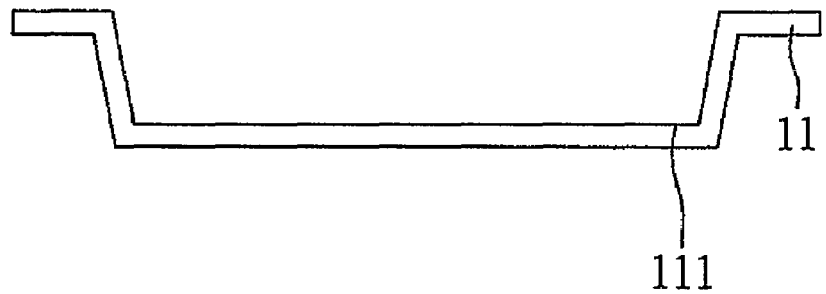
FIGS. 2A to 2F illustrate a fabrication method for fabricating the heat sink shown in FIG. 1 according to the present invention.

First, as shown in FIG. 2A, the lower substrate 11 is fabricated. The lower substrate 11 is made of copper, aluminum or alloy thereof. In the present invention, a central portion of the lower substrate 11 has a concave portion 111, which has a size defined according to volume of the cooled liquid to be injected to the lower substrate 11.

Figure 2B:
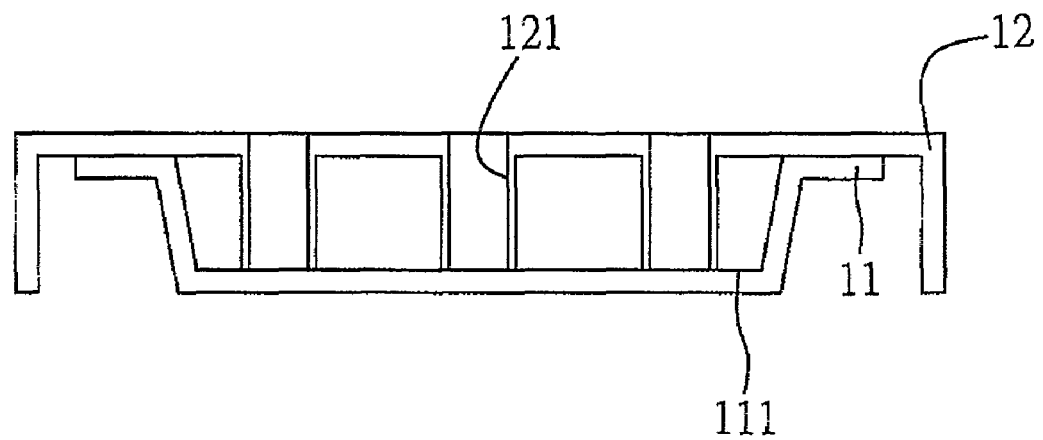

Then, as shown in FIG. 2B, a material injection board 12 having a plurality of through holes 121 is disposed on the concave portion 111 of the lower substrate 11 wherein, the through holes 121 of the material injection board 12 are located at positions of the lower substrate 11 where supporting columns 131 are to be formed. In the present embodiment, the through holes 121 of the material injection board 12 have cylindrical structures respectively. Preferably, the diameters of the through holes 12 are same. Of course, the through holes 121 may be of other structure.

Figure 2C:
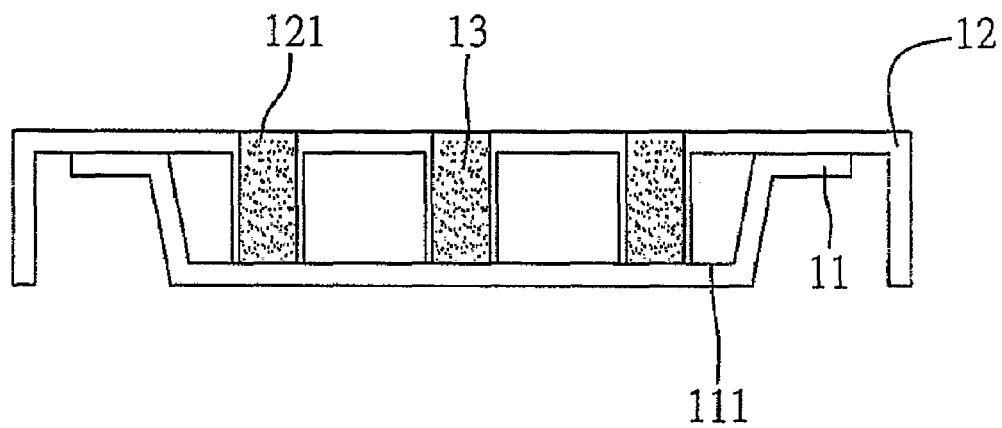
Figure 2D:
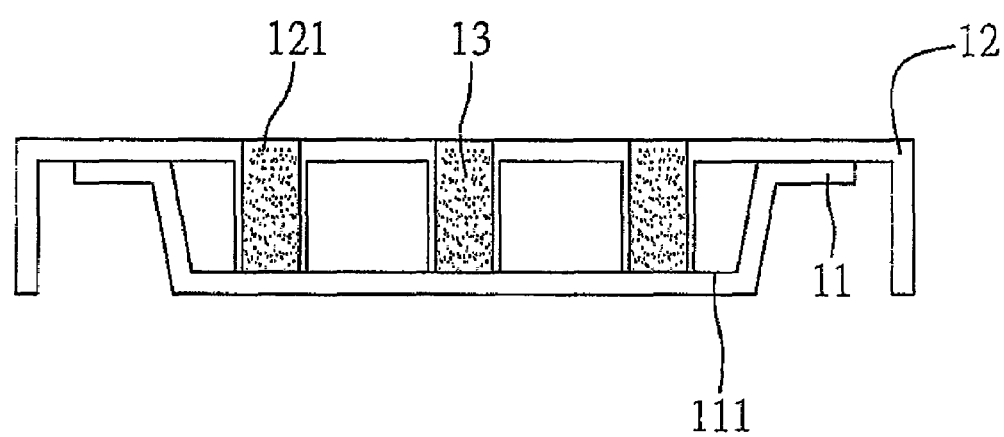

As shown in FIG. 2C, aggregate 13 is injected into the through holes 121. The aggregate 13 can be made of copper, aluminum or alloy thereof In the present embodiment, the aggregate 13 is predisposed above the material injection board 12 and injected into the through holes 121 while being shaken. Further, as shown in FIG. 2D, the lower substrate 11, the material injection board 12 and the aggregate 13 are disposed under a high temperature environment for sintering. In the present embodiment, the high temperature environment is provided by a high temperature furnace.

Figure 2E:
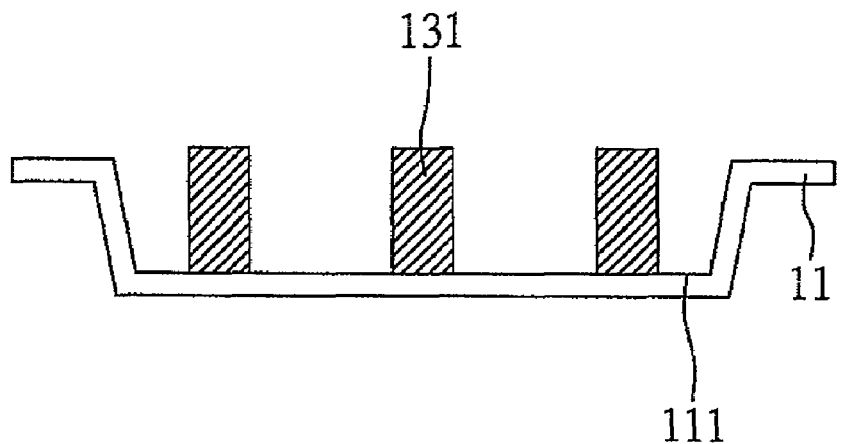

Subsequently, as shown in FIG. 2E, after the aggregate 13 is formalized, the material injection board 12 is removed from the lower substrate 11. Thereby, a plurality of supporting columns 131 is formed on the concave portion of the lower substrate 11. In the present embodiment, after the aggregate 13 is sintered, the lower substrate 11, the material injection board 12 and the aggregate 13 are removed from the high temperature environment, and the material injection board 12 is removed from the lower substrate 11 so as to form supporting columns 131.

Figure 2F:
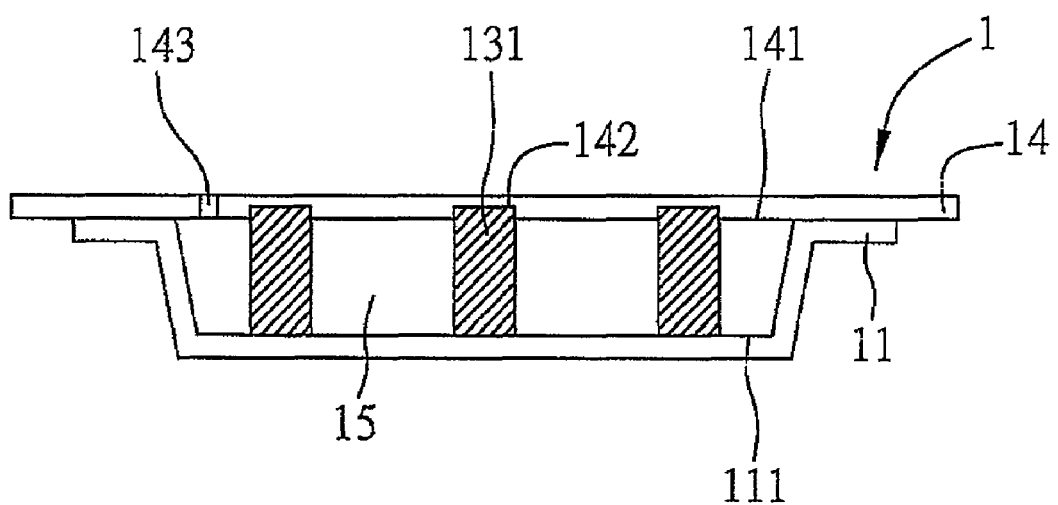
Figure 3A:
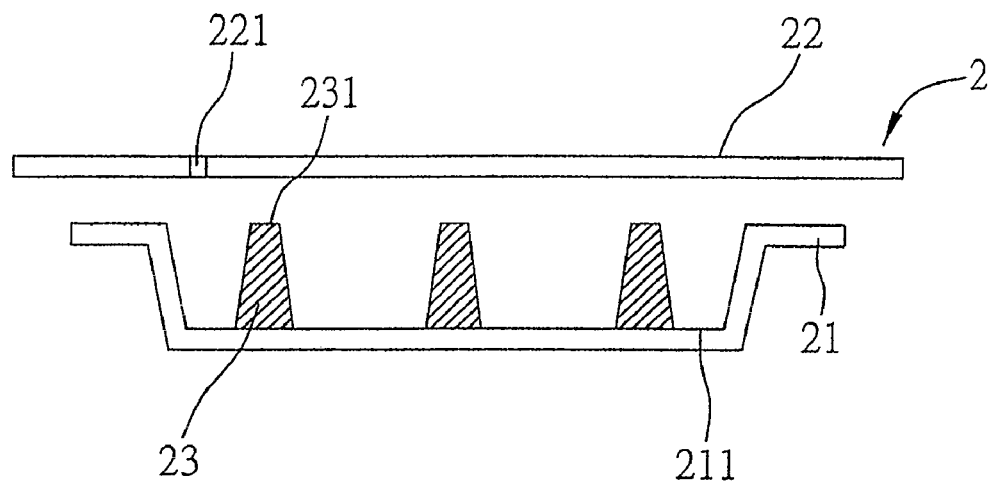
FIG. 3A is a diagram of an exploded diagram of a conventional liquid cooled heat sink.
Figure 3B:
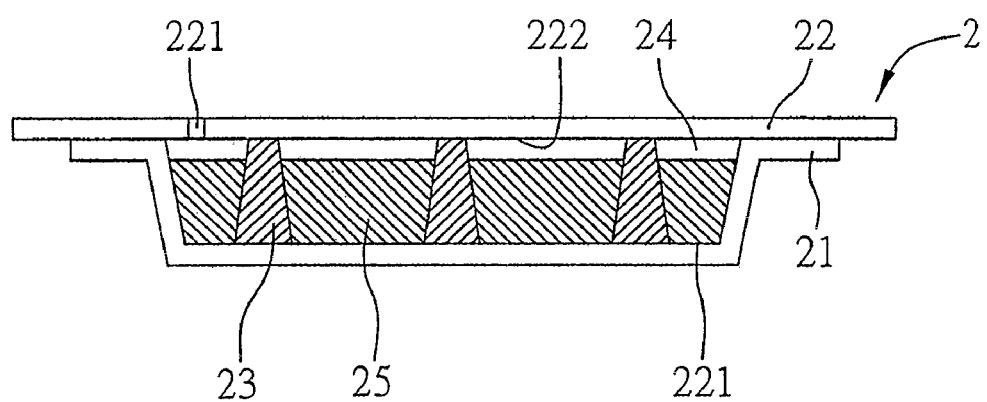
FIG. 3B is a diagram of a liquid cooled heat sink after assembly.
Figure 4:
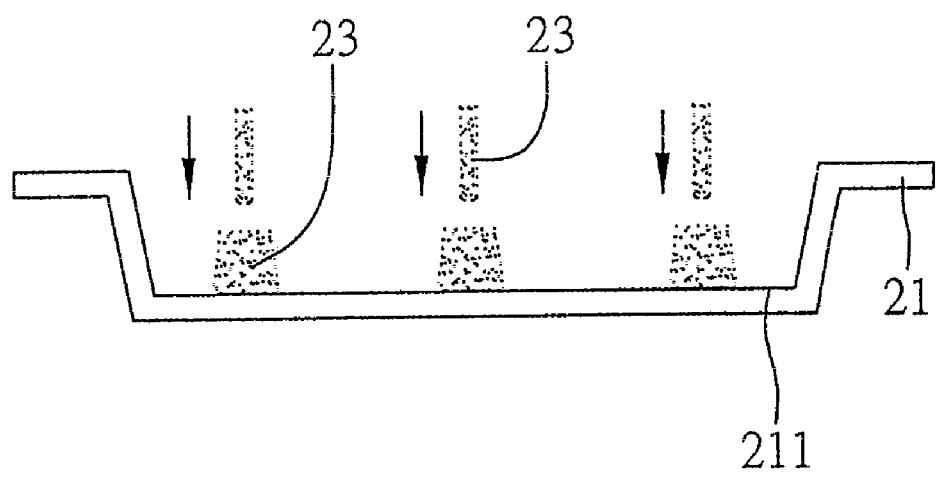
FIG. 4 shows a fabrication process of supporting columns of the conventional liquid cooled heat sink.

Finally, as shown in FIG. 2F, an upper substrate 14 is prepared and tightly fixed with the lower substrate 11 so as to form a cooled liquid receiving space 15. Therein, the upper substrate 14 has a plurality of concave portions 142 on surface 141 thereof for engaging with the supporting columns 131. In the present embodiment, the upper substrate 14 further comprises a through hole 143 formed at a corner thereof. A cooled liquid can be injected through the through hole 143 into the receiving space 15. Thereafter, the through hole 143 is sealed by a sealing member (not shown) or soldering. Thus, through convection of the cooled liquid in the receiving space 15, the heat dissipating efficiency of the heat sink 1 is improved.

According to the present invention, capillary structure and density of the supporting columns can be controlled and improved. Meanwhile, the combining structure between the upper substrate and the supporting columns is intensified and capillary structure continuity is increased. Thus, heat dissipating efficiency of the heat sink is improved.

The above-described descriptions of the detailed embodiments are only to illustrate the preferred implementation according to the present invention, and it is not to limit the scope of the present invention, i.e., other changes still can be implemented in the present invention. Accordingly, all modifications and variations completed by those with ordinary skill in the art should fall within the scope of present invention defined by the appended claims.

What is claimed is:

1. A fabrication method for fabricating a heat sink, the fabrication method comprising:

provding a lower substrate having a concave portion;

disposing a material injection board having a through hole on the concave portion of the lower substrate, the through hole of the material injection board being located at a position of the lower substrate where a supporting column is to be formed;

injecting aggregate into the through hole of the material injection board;

sintering the substrate, the material injection board and the aggregate;

removing the material injection board from the lower substrate after the aggregate is formalized so as to form the supporting column on the concave portion of the lower substrate; and providing an upper substrate and tightly fixing the upper substrate to the lower substrate so as to form a receiving space, the upper substrate having a concave portion formed at the position corresponding to the supporting column of the lower substrate so as to engage with the supporting column.

2. The fabrication method of claim 1, wherein the concave portion is located at the central portion of the lower substrate.

3. The fabrication method of claim 1, wherein the lower substrate is made of materials selected from the group consisting of copper, aluminum and alloy thereof.

4. The fabrication method of claim 1, wherein the through hole of the injection material board has a cylindrical structure.

5. The fabrication method of claim 1, wherein the aggregate is made of materials selected from the group consisting of copper, aluminum and alloy thereof.

6. The fabrication method of claim 1, wherein the upper substrate has a through hole formed at a corner thereof, through which a cooled liquid can be injected into the receiving space after the upper and lower substrates are tightly fixed together.

7. The fabrication method of claim 6, further comprising injecting a cooled liquid through the through hole of the upper substrate into the receiving space after the upper and lower substrates are tightly fixed together, and sealing the through hole of the upper substrate.

8. The fabrication method of claim 1, wherein the aggregate is pre-disposed above the material injection board, and injected into the through hole of the material injection board while being shaken.

9. A heat sink fabricated by the fabrication method of claim 1, comprising:
   a lower substrate having a concave portion;
   a supporting column formed on the concave portion of the lower substrate; and
   an upper substrate opposed to the lower substrate and tightly fixed to the lower substrate so as to form a cooled liquid receiving space therebetween, wherein the upper substrate has a concave portion formed at a position corresponding to the supporting column of the lower substrate so as to engage with the supporting column.

10. The heat sink of claim 9, wherein the concave portion of the lower substrate is located at a central portion of the lower substrate.

11. The heat sink of claim 9, wherein the lower substrate is made of materials selected from the group consisting of copper, aluminum and alloy thereof.

12. The fabrication method of claim 9, wherein the upper substrate has a through hole formed at a corner thereof, through which a cooled liquid can be injected into the receiving space after the upper and lower substrates are tightly fixed together.

* * * * *